(12) United States Patent
Terui

(10) Patent No.: US 7,696,630 B2
(45) Date of Patent: Apr. 13, 2010

(54) SEMICONDUCTOR DEVICE

(75) Inventor: Makoto Terui, Yamanashi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 80 days.

(21) Appl. No.: 11/905,917

(22) Filed: Oct. 5, 2007

(65) Prior Publication Data

US 2008/0099930 A1    May 1, 2008

(30) Foreign Application Priority Data

Oct. 30, 2006    (JP)    ............................. 2006-293588

(51) Int. Cl.
*H01L 23/48* (2006.01)
*H01L 21/00* (2006.01)
*H05K 7/10* (2006.01)

(52) U.S. Cl. .................. 257/784; 438/166; 361/767

(58) Field of Classification Search ................ 275/784, 275/734, E23.01; 257/784, 615, 782; 438/149, 438/286, 455, 622; 361/760, 720, 748, 767
See application file for complete search history.

(56) References Cited

U.S. PATENT DOCUMENTS

| | | | | |
|---|---|---|---|---|
| 5,394,096 A | * | 2/1995 | Meyer | 324/686 |
| 6,509,633 B1 | * | 1/2003 | Takagi | 257/678 |
| 2003/0205808 A1 | * | 11/2003 | Terui et al. | 257/738 |
| 2007/0021089 A1 | * | 1/2007 | Terui et al. | 455/323 |
| 2007/0070229 A1 | * | 3/2007 | Shizuno | 348/294 |

FOREIGN PATENT DOCUMENTS

| | | | |
|---|---|---|---|
| JP | 2002-057292 | * | 2/2002 |
| JP | 2003-209181 | | 7/2003 |
| JP | 2004-079579 | | 3/2004 |
| JP | 2004-235351 | | 8/2004 |
| JP | 2004-320047 | | 11/2004 |
| JP | 2004-356119 | | 12/2004 |
| JP | 2005-123486 | | 5/2005 |

* cited by examiner

*Primary Examiner*—Thomas L Dickey
*Assistant Examiner*—Nikolay Yushin
(74) *Attorney, Agent, or Firm*—Rabin & Berdo, P.C.

(57) ABSTRACT

The present invention provides a semiconductor device which is applied to, for example, a WCSP (Wafer Level Chip Size Package) and comprises a semiconductor chip having a high-frequency circuit block, a plurality of electrode pads formed on the semiconductor chip, posts disposed between the high-frequency circuit block and the electrode pads within a horizontal plane and connected to their corresponding external terminals, and redistribution wiring layers that connect the electrode pads and the posts respectively.

11 Claims, 5 Drawing Sheets

SEMICONDUCTOR DEVICE

BACKGROUND OF THE INVENTION

The present invention relates to a semiconductor device, and particularly to a semiconductor device wherein a wafer level CSP is applied to a high-frequency LSI.

With high-density packaging of electronic equipment, there has been a demand for a size reduction (thinning/reduction in outer size) of a semiconductor device mounted in a portable device. In order to meet its demand, a semiconductor package called "Chip Size Package" having approximately the same outer dimensions as those of a semiconductor chip has been adopted. As one form of the chip size package, a semiconductor package called a wafer level chip size package or a wafer level chip scale package exists.

In the wafer level chip size package (hereinafter called "WCSP"), a plurality of external terminals arranged in area form by redistribution wiring layers are provided on a mounting surface (circuit forming surface) that faces a mounting substrate or board. The external terminals and electrodes (pads) disposed on the periphery of the circuit forming surface are connected by redistribution wirings thereby to convert wiring pitches on a circuit to wiring pitches for the mounting board and electrically connect an LSI circuit and the mounting board. The WCSP is now being adopted for a power-supply LSI, a flash memory, a microcomputer, RF, an LSI and the like of a cellular phone by taking advantage of the merit of its size reduction and thinning.

As a technique related to the present invention, there is known a WCSP type semiconductor device disclosed in Japanese Unexamined Patent Publication No. 2004-79579.

When the WCSP is applied to a high-frequency LSI, the area for routing redistribution wirings for the WCSP is limited depending upon a circuit layout on the LSI side. Therefore, there is a fear that a high-frequency circuit block and redistribution wirings electrically interfere therein and hence a malfunction will occur. There is a case in which since the transmission/reception of signals of a few hundreds of MHz to a few GHz is done in a wireless communication LSI of a cellular phone or the like in particular, the characteristic of the LSI is degraded depending upon the layout of each redistribution wiring.

SUMMARY OF THE INVENTION

The present invention has been made to solve the foregoing problems. An object of the present invention is to improve the characteristic of a semiconductor device equipped with a high-frequency LSI.

According to one aspect of the present invention, for attaining the above object, there is provided a semiconductor device which is applied to, for example, a WCSP (Wafer Level Chip Size Package) and which comprises a semiconductor chip having a high-frequency circuit block, a plurality of electrode pads formed over the semiconductor chip, posts disposed between the high-frequency circuit block and the electrode pads and respectively connected to external terminals, and redistribution wiring layers which connect the electrode pads and the posts respectively. Here, the point is that the posts are disposed between the high-frequency circuit block and the electrode pads, and such a layout that the redistribution wirings are not formed on the high-frequency circuit block is provided.

Preferably, the redistribution wring layers connected to their corresponding ground electrode pads are formed so as to be routed between the ground electrode pads and the edge of the semiconductor chip.

Signal electrode pads are respectively formed directly below the posts, and the signal electrode pads and the posts are connected to one another without via the redistribution wiring layers.

Transmitting and receiving antenna electrode pads can respectively be disposed between the corresponding ground electrode pads and the high-frequency circuit block. Further, spiral inductors can respectively be formed midway through redistribution wirings for coupling the transmitting and receiving antenna electrode pads and the posts.

According to the present invention as described above, posts are disposed between electrode pads and a high-frequency circuit block. Therefore, each redistribution wiring is not formed on the high-frequency circuit block, and the electrical interference between the redistribution wirings and the high-frequency circuit block can be suppressed. Further, the lengths of signal redistribution wirings for connecting a transmitting antenna electrode, a receiving antenna electrode and the posts respectively can be shortened and an improvement in transmission/reception characteristic can be effected.

When redistribution wiring layers connected to their corresponding ground electrode pads are routed between the ground electrode pads and the edge of a semiconductor chip, ground terminals can be shared outside electrodes, and each ground wiring can be brought into low impedance.

When signal electrode pads are formed directly below their corresponding posts, and these signal electrode pads and posts are connected to one another, the redistribution wirings become unnecessary, and hence degradation in transmission/reception characteristic of a high-frequency signal due to a parasitic parameter (LCR) component of each redistribution wiring portion can be reduced.

Further, when the transmitting and receiving antenna electrode pads are disposed between the ground electrode pads and the high-frequency circuit block, and spiral inductors are formed midway through the redistribution wirings for coupling the transmitting and receiving antenna electrode pads and the posts respectively, the corresponding inductors can be formed by the redistribution wirings, and a size reduction of a module with a high-frequency LSI mounted thereon can be effected.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

Figure 1:
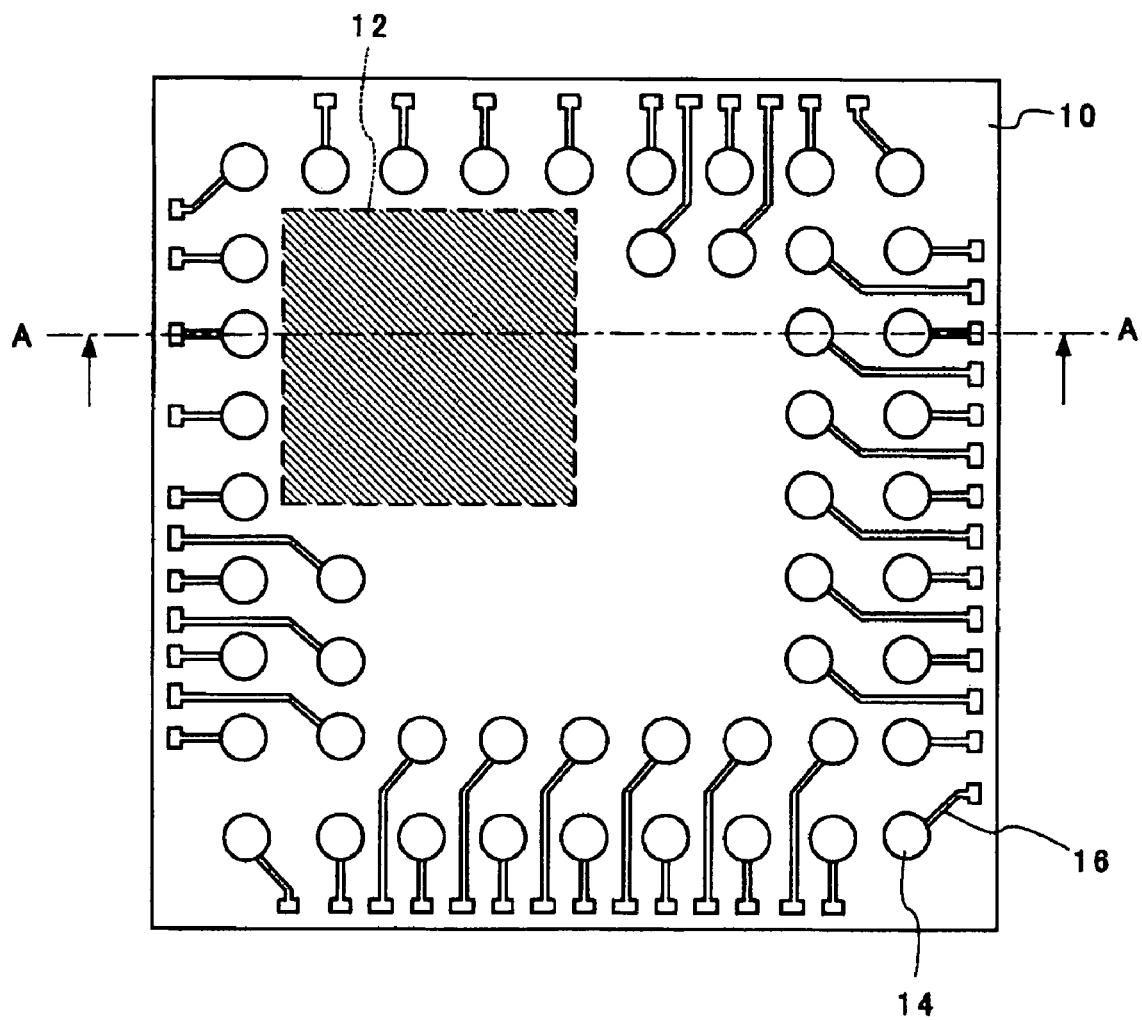
FIG. 1 is a plan view showing the configuration of a WCSP (Wafer Level Chip Size Package) to which the present invention is applicable, except for an encapsulating resin and external terminals.
Figure 2:
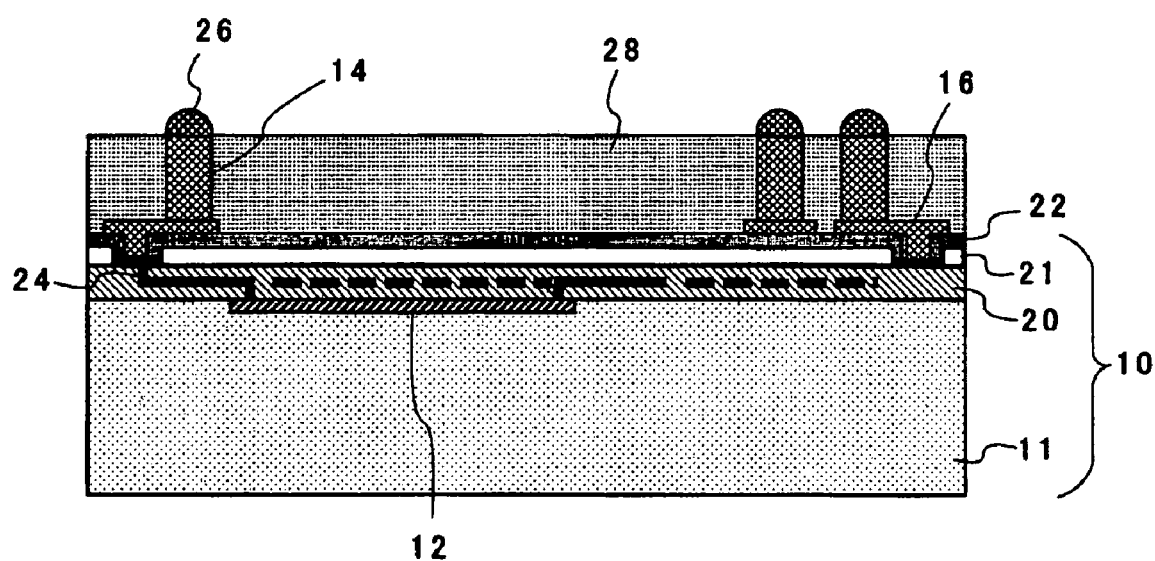
FIG. 2 is a sectional view taken along line A-A of FIG. 1 and also shows the encapsulating resin and the external terminals.

FIG. 1 is a plan view showing the configuration of a WCSP (Wafer Level Chip Size Package) to which the present invention is applicable. An encapsulating resin and external terminals are omitted from FIG. 1. FIG. 2 is a sectional view taken along line A-A of FIG. 1 and also shows the encapsulating resin and the external terminals.

The WCSP includes a semiconductor chip 10, an insulator layer 22 formed in the surface of the semiconductor chip 10, redistribution wiring layers 16 formed on the insulator layer 22, posts 14 respectively connected to the redistribution wiring layers 16, a sealing or encapsulating resin 28 for sealing the surface of the semiconductor chip 10, and external solder terminals 26 formed on the encapsulating resin 28 and connected to the exposed upper surfaces of the posts 14. The present invention is suitable for a wireless communication LSI or the like which performs transmission/reception of signals of a few hundreds of MHz to a few GHz.

The semiconductor chip 10 includes a semiconductor substrate 11, a high-frequency circuit block 12 provided on the semiconductor substrate 11, and aluminum wiring layers 24 connected to the high-frequency circuit block 12 and electrode pads. The aluminum wiring layers 24 are covered with a silicon oxide film 20, and a silicon nitride film 21 is formed on the silicon oxide film 20 as a passivation film.

First Preferred Embodiment

Figure 3:
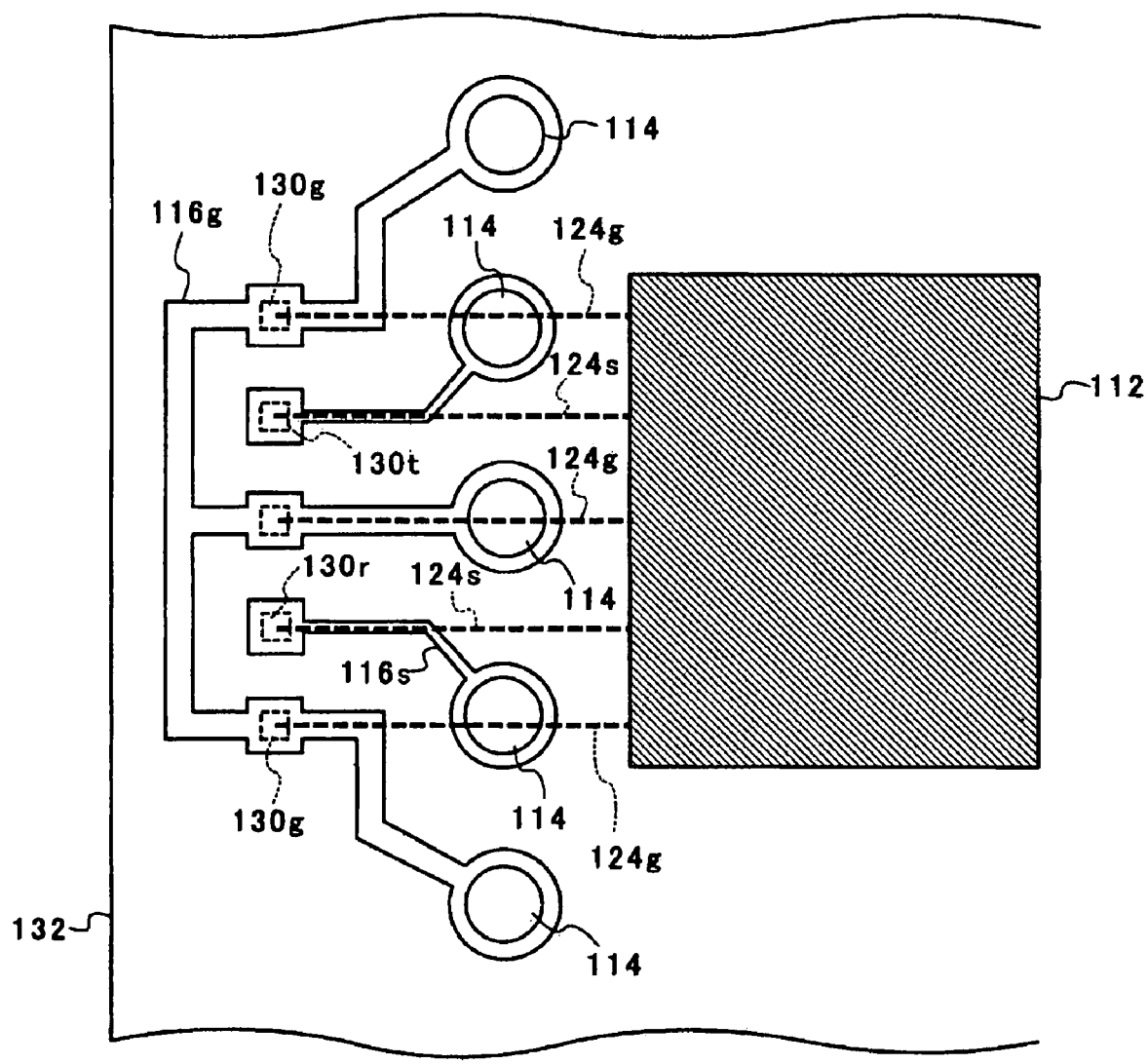
FIG. 3 is a plan view illustrating the essential structure of a WCSP according to a first embodiment of the present invention.

FIG. 3 is a plan view showing an essential structure (wiring layout) of a WCSP according to a first embodiment of the present invention. In the present embodiment, an area for routing a ground (GND) redistribution wiring 116g is ensured between electrode pads (130g, 130r and 130t) and a chip edge 132. Posts 114 of the WCSP are disposed between a high-frequency circuit block 112 and the electrode pads (130g, 130r and 130t). Incidentally, the electrode pads include ground electrode pads 130g, a transmitting antenna electrode pad 130t, and a receiving antenna electrode pad 130r.

A plurality of the ground electrode pads 130g are respectively electrically connected to the ground redistribution wiring 116g in an area located outside the electrodes. A plurality of the posts 114 are disposed between the respective electrode pads 130g and the high-frequency circuit block 112. The electrode pads 130g and the posts 114 are respectively connected to one another by the ground redistribution wiring 116g. Here, the ground redistribution wiring 116g is preferably set as thick (wide) as possible within a range free of the occurrence of a problem in package reliability to reduce the impedance thereof.

On the other hand, the transmitting antenna electrode pad 130t and the receiving antenna electrode pad 130r are electrically connected to their corresponding posts 114 disposed between the respective electrodes (130r and 130t) and the high-frequency circuit block 112 by means of signal redistribution wirings 116s. At this time, the lengths of the respective signal redistribution wirings 116s are respectively set to the same length to eliminate a phase difference. Further, the signal redistribution wirings may preferably be routed in such a manner that their wiring lengths become as short as possible.

In FIG. 3, reference numerals 124g indicate aluminum wirings connected to their corresponding ground electrode pads 130g, which are formed inside a semiconductor chip. Reference numerals 124s indicate aluminum wirings connected to the transmitting and receiving antenna electrode pads 130t and 130r, which are formed inside the semiconductor chip in like manner.

In the present embodiment, the redistribution wiring area is ensured outside the respective electrode pads (130g, 130r and 130t), and the posts 114 are disposed between the respective electrodes (130g, 130r and 130t) and the high-frequency circuit block 112. Therefore, no redistribution wiring is formed and hence the electrical interference between the redistribution wirings 116s and 116g and the high-frequency circuit block 112 can be avoided. Since such routing that the lengths of the signal redistribution wirings 116s for connecting the transmitting antenna electrode pad 130t, the receiving antenna electrode pad 130r and the posts 114 become the shortest can be performed, an improvement in transmission/reception characteristic can be effected.

Further, ground terminals are shared by the ground redistribution wiring 116g in an area located outside the respective electrode pads (130g, 130r and 130t), so that the ground wiring 116g can be brought into low impedance.

Second Preferred Embodiment

Figure 4:
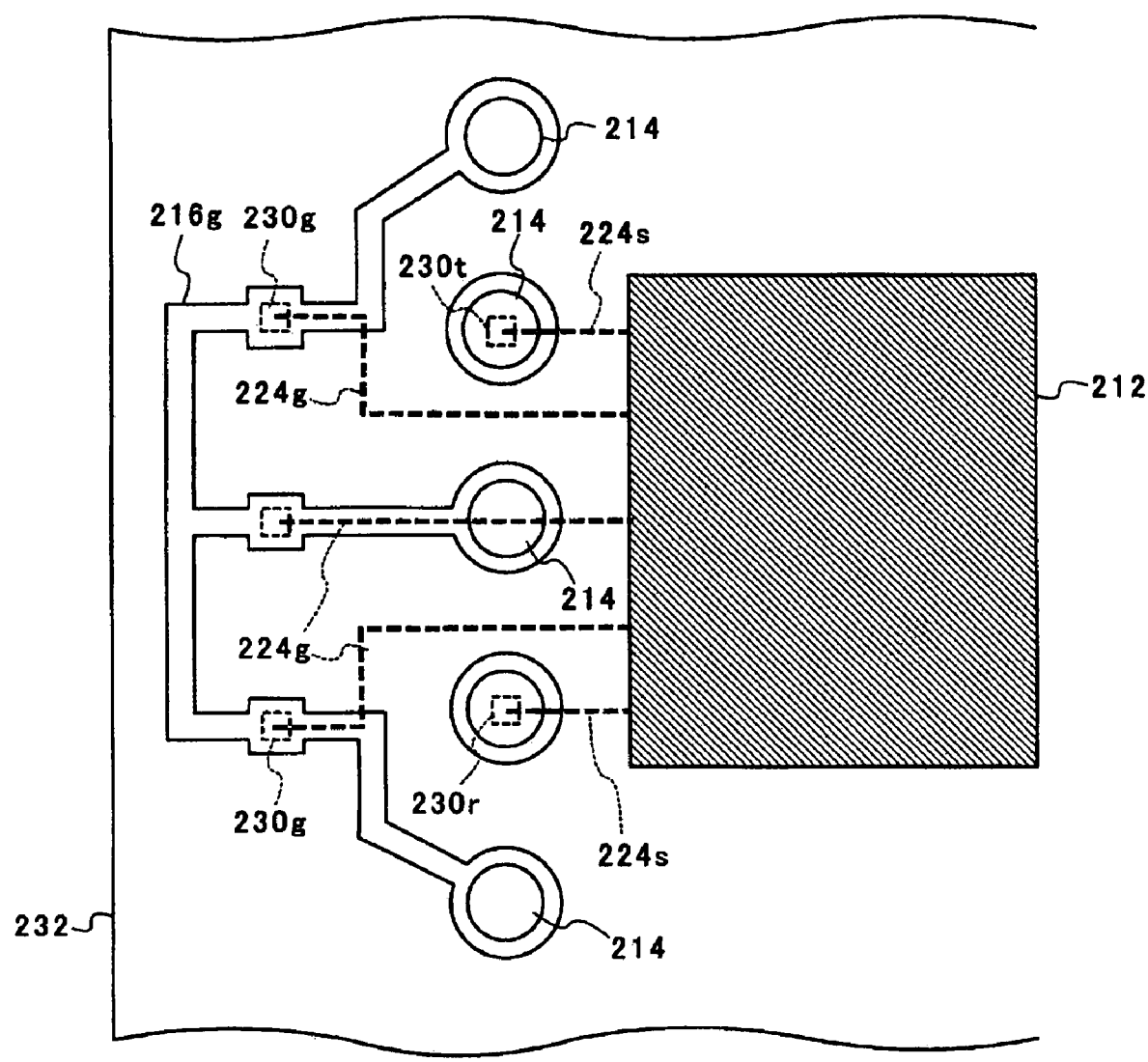
FIG. 4 is a plan view depicting the essential structure of a WCSP according to a second embodiment of the present invention.

FIG. 4 is a plan view showing an essential structure (wiring layout) of a WCSP according to a second embodiment of the present invention. In the present embodiment, an area for routing a ground (GND) redistribution wiring 216g is ensured between electrode pads (230g, 230r and 230t) and a chip edge 232 in a manner similar to the first embodiment. Posts 214 of the WCSP are disposed between a high-frequency circuit block 212 and the electrode pads (230g, 230r and 230t). Here, the present embodiment is characterized in that transmitting and receiving antenna electrode pads 230t and 203r are respectively disposed directly below transmitting and receiving antenna posts 214 of the posts 214.

A plurality of the ground electrode pads 230g are electrically connected to the ground redistribution wiring 216g in an area located outside the electrodes. A plurality of the posts 114 are disposed between the respective electrode pads 230g and the high-frequency circuit block 212. These electrode pads and posts are respectively connected to one another by the ground redistribution wiring 216g. Here, the ground redistribution wiring 216g is preferably set as thick (wide) as possible within a range free of the occurrence of a problem in package reliability to reduce the impedance thereof.

On the other hand, the transmitting antenna electrode pad 230t and the receiving antenna electrode pad 230r are directly connected to their corresponding posts 214 disposed directly thereabove (without via the redistribution wiring).

In FIG. 4, reference numerals 224g indicate aluminum wirings connected to their corresponding ground electrode pads 230g, which are formed inside a semiconductor chip. Reference numerals 224s indicate aluminum wirings connected to the transmitting and receiving antenna electrode pads 230t and 230r, which are formed inside the semiconductor chip in like manner.

In the present embodiment, the redistribution wiring area is ensured outside the respective electrode pads (230g, 230r and 230*t*). Therefore, each redistribution wiring is not formed on the high-frequency circuit block 212, and hence the electrical interference between the redistribution wiring 216*g* and the high-frequency circuit block 212 can be avoided. Since the transmitting antenna electrode pad 230*t* and the receiving antenna electrode pad 230*r* are connected to their corresponding posts 214 disposed directly thereabove, no redistribution wiring is required and hence degradation in transmission/reception characteristic of a high-frequency signal due to a parasitic parameter (LCR) component of each redistribution wiring portion can be reduced.

Further, ground terminals are shared by the ground redistribution wiring 216*g* in an area located outside the respective electrode pads (230*g*, 230*r* and 230*t*), so that the ground wiring 216*g* can be brought into low impedance.

Third Preferred Embodiment

Figure 5:
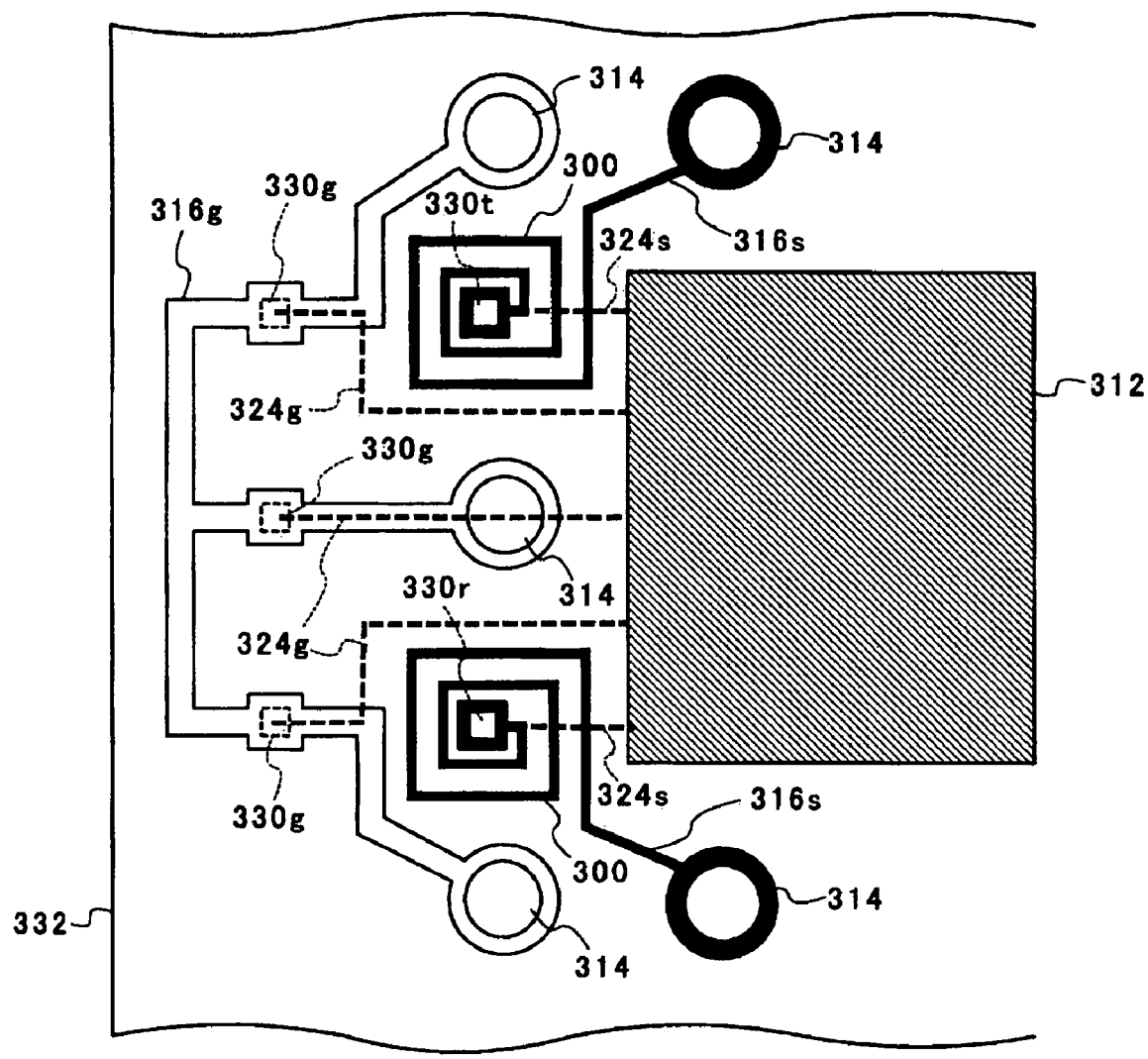
FIG. 5 is a plan view showing the essential structure of a WCSP according to a third embodiment of the present invention.

FIG. 5 is a plan view showing an essential structure (wiring layout) of a WCSP according to a third embodiment of the present invention. In the present embodiment, an area for routing a ground (GND) redistribution wiring 316*g* is ensured between electrode pads (330*g*, 330*r* and 330*t*) and a chip edge 332 in a manner similar to the first and second embodiments. Posts 314 connected to their corresponding ground electrode pads 330*g* are disposed between a high-frequency circuit block 312 and the electrode pads (330*g*, 330*r* and 330*t*).

In the present embodiment, the transmitting and receiving antenna electrode pads 330*t* and 330*r* are disposed inside (on the high-frequency circuit block 312 side) than the ground electrode pads 330*g*. The transmitting and receiving antenna electrode pads 330*t* and 330*r* are connected to their corresponding posts 314 disposed further inside than the transmitting and receiving antenna electrode pads 330*t* and 330*r* by means of redistribution wiring layers 316*s*. Spiral inductors 300 are formed midway through the redistribution wiring layers 316*s* by the redistribution wiring layers 316*s*. The inductance of each spiral inductor 300 is set to the same degree as the value of the conventional one (equivalent to one mounted, as a chip part, to the outside of each of transmitting/receiving antenna terminals provided on a module substrate with an LSI mounted thereon. The lengths of the signal redistribution wirings 316*s* including the spiral inductors 300 are set to the same length to eliminate a phase difference.

A plurality of the ground electrode pads 330*g* are electrically connected to the ground redistribution wiring 316*g* in an area located outside the electrodes. A plurality of the posts 314 are disposed between the respective ground electrode pads 330*g* and the high-frequency circuit block 312. The posts 314 are respectively connected to one another by the ground redistribution wiring 316*g*. Here, the ground redistribution wiring 316*g* is preferably set as thick as possible within a range free of the occurrence of a problem in package reliability to reduce the impedance thereof.

On the other hand, the transmitting antenna electrode pad 330*t* and the receiving antenna electrode pad 330*r* are connected to their corresponding posts 314 by the signal redistribution wirings 316*s* with the spiral inductors 300 interposed therein.

In FIG. 5, reference numerals 324*g* indicate aluminum wirings connected to their corresponding ground electrode pads 330*g*, which are formed inside a semiconductor chip. Reference numerals 324*s* indicate aluminum wirings connected to the transmitting and receiving antenna electrode pads 330*t* and 330*r*, which are formed inside the semiconductor chip in like manner.

In the present embodiment, the redistribution wiring area is ensured outside the respective electrode pads (330*g*, 330*r* and 330*t*). Therefore, each redistribution wiring is not formed on the high-frequency circuit block 312, and hence the electrical interference between the redistribution wiring 316*g* and the high-frequency circuit block 312 can be avoided. Further, ground terminals are shared by the ground redistribution wiring 316*g* in an area located outside the respective electrode pads (330*g*, 330*r* and 330*t*), so that the ground wiring 316*g* can be brought into low impedance.

Further, the formation of the spiral inductors 300 each having a characteristic equivalent to that of each chip inductor that has heretofore been disposed on the module substrate, within the WCSP by means of the redistribution wirings 316*s* contributes to a size reduction of a module with a high-frequency LSI mounted thereon.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
   a semiconductor chip including a semiconductor substrate and a high-frequency circuit block, the semiconductor substrate having a main surface, the main surface including a first area on which the high-frequency circuit block is disposed and a second area located around the first area;
   a plurality of electrode pads formed above the semiconductor substrate in the second area;
   posts formed above the semiconductor substrate in the second area, the posts being disposed between the high-frequency circuit block and the electrode pads and respectively connected to external terminals; and
   redistribution wiring layers which connect the electrode pads and the posts respectively, the redistribution wiring layers being formed above the semiconductor substrate in the second area, but not being formed above the semiconductor substrate in the first area,
   wherein the semiconductor chip further includes:
   a silicon oxide film formed on the main surface of the semiconductor substrate;
   aluminum wiring layers formed in and covered by the silicon oxide film, and connecting the high-frequency circuit block and the electrode pads; and
   a silicon nitride film formed on the silicon oxide film.

2. The semiconductor device according to claim 1, wherein the electrode pads include signal electrode pads and ground electrode pads.

3. The semiconductor device according to claim 2, wherein the signal electrode pads include a transmitting antenna electrode pad and a receiving antenna electrode pad for wireless communication.

4. The semiconductor device according to claim 2, wherein the redistribution wring layers connected to the ground electrode pads, taken from a plan view of the semiconductor device, includes a first portion that is disposed between the ground electrode pads and an adjacent edge of the semiconductor chip.

5. The semiconductor device according to claim 2, wherein the signal electrode pads are respectively formed directly below the posts, and the signal electrode pads and the posts are directly connected to one another without via the redistribution wiring layers.

6. The semiconductor device according to claim 3, wherein the transmitting antenna electrode pad and the receiving antenna electrode pad are disposed between the ground electrode pads and the high-frequency circuit block, and wherein spiral inductors are formed midway through the redistribution wiring layers for coupling the transmitting antenna electrode pad and the receiving antenna electrode pad, and the posts.

7. The semiconductor device according to claim 1, which is of a WCSP (Wafer Level Chip Size Package) type.

8. The semiconductor device according to claim 1, wherein one end of each aluminum wiring layer is connected with the high-frequency circuit block and the other end of each aluminum wiring layer is connected with a corresponding electrode pad.

9. A semiconductor device comprising:
a semiconductor chip including a semiconductor substrate and a high-frequency circuit block, the semiconductor substrate having a main surface, the main surface including a first area on which the high-frequency circuit block is disposed and a second area located around the first area;
a plurality of electrode pads formed above the semiconductor substrate in the second area;
posts formed above the semiconductor substrate in the second area, the posts being disposed between the high-frequency circuit block and the electrode pads and respectively connected to external terminals; and
redistribution wiring layers which connect the electrode pads and the posts respectively, the redistribution wiring layers being formed above the semiconductor substrate in the second area, but not being formed above the semiconductor substrate in the first area,
wherein the electrode pads include signal electrode pads and ground electrode pads, and
wherein the redistribution wring layers connected to the ground electrode pads, taken from a plan view of the semiconductor device, includes a first portion that is disposed between the ground electrode pads and an adjacent edge of the semiconductor chip, and
wherein, when taken from a plan view of the semiconductor device, the first portion of redistribution wiring layers connected to the ground electrode pads is disposed above the main surface in an area between the ground electrode pads and the adjacent edge of the semiconductor chip.

10. A semiconductor device comprising:
a semiconductor chip including a semiconductor substrate and a high-frequency circuit block, the semiconductor substrate having a main surface, the main surface including a first area on which the high-frequency circuit block is disposed and a second area located around the first area;
a plurality of electrode pads formed above the semiconductor substrate in the second area;
posts formed above the semiconductor substrate in the second area, the posts being disposed between the high-frequency circuit block and the electrode pads and respectively connected to external terminals; and
redistribution wiring layers which connect the electrode pads and the posts respectively, the redistribution wiring layers being formed above the semiconductor substrate in the second area, but not being formed above the semiconductor substrate in the first area,
wherein the electrode pads include signal electrode pads and ground electrode pads, and
wherein the redistribution wring layers connected to the ground electrode pads, taken from a plan view of the semiconductor device, includes a first portion that is disposed between the ground electrode pads and an adjacent edge of the semiconductor chip, and
wherein the first portion connects the ground electrode pads to each other.

11. A semiconductor device comprising:
a semiconductor chip including a semiconductor substrate and a high-frequency circuit block, the semiconductor substrate having a main surface, the main surface including a first area on which the high-frequency circuit block is disposed and a second area located around the first area;
a plurality of electrode pads formed above the semiconductor substrate in the second area;
posts formed above the semiconductor substrate in the second area, the posts being disposed between the high-frequency circuit block and the electrode pads and respectively connected to external terminals; and
redistribution wiring layers which connect the electrode pads and the posts respectively, the redistribution wiring layers being formed above the semiconductor substrate in the second area, but not being formed above the semiconductor substrate in the first area,
wherein the electrode pads include signal electrode pads and ground electrode pads, and
wherein:
the redistribution wiring layers connected to the ground electrode pads include a first portion and a second portion;
the first portion, taken from a plan view of the semiconductor device, is disposed between the ground electrode pads and an adjacent edge of the semiconductor chip, the first portion connecting the ground electrode pads to each other; and
the second portion, taken from a plan view of the semiconductor device, is disposed between the ground electrode pads and the posts, the second portion connecting the ground electrode pads to the posts.

* * * * *